(12) United States Patent
Tillman

(10) Patent No.: US 7,945,230 B2
(45) Date of Patent: May 17, 2011

(54) TIME-MULTIPLEXED COMMON MODE FEEDBACK FOR PASSIVE QUADRATURE RF MIXERS

(75) Inventor: Fredrik Tillman, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 575 days.

(21) Appl. No.: 12/118,517

(22) Filed: May 9, 2008

(65) Prior Publication Data

US 2009/0280767 A1    Nov. 12, 2009

(51) Int. Cl.
  *H04B 1/26* (2006.01)
(52) U.S. Cl. .......................... 455/324; 455/326
(58) Field of Classification Search .............. 455/285, 455/292, 293, 296, 302, 313, 323, 324, 326
See application file for complete search history.

(56) References Cited

U.S. PATENT DOCUMENTS

| | | | |
|---|---|---|---|
| 6,191,622 B1 | 2/2001 | Watson | |
| 7,085,548 B1 | 8/2006 | Kluge et al. | |
| 2003/0130006 A1* | 7/2003 | Reynolds | ............ 455/550 |
| 2005/0143044 A1 | 6/2005 | Kim | |
| 2005/0170806 A1 | 8/2005 | Kim | |
| 2005/0243893 A1 | 11/2005 | Ranganathan et al. | |
| 2007/0142018 A1 | 6/2007 | Lin et al. | |
| 2008/0051055 A1 | 2/2008 | Hwang et al. | |

OTHER PUBLICATIONS

Brandolini, M. et al. "A 750 mV Fully Integrated Direct Conversion Receiver Front-End for GSM in 90-nm CMOS." IEEE Journal of Solid-State Circuits, vol. 42, No. 6, Jun. 2007, pp. 1310-1317.
Brandolini, M. et al. "A +78 dBm IIP2 CMOS Direct Downconversion Mixer for Fully Integrated UMTS Receivers." IEEE Journal of Solid-State Circuits, vol. 41, No. 3, Mar. 2006, pp. 552-559.

* cited by examiner

Primary Examiner — Nguyen Vo
(74) Attorney, Agent, or Firm — Coats & Bennett, P.L.L.C.

(57) ABSTRACT

A passive, differential RF mixer reduces second order intermodulation interference while maintaining I/Q isolation via common mode feedback wherein the I and Q error signals in the feedback path are time multiplexing using a four-phase LO signal. An RF signal is received at a differential input having a center tap. The RF signal is mixed with an in-phase differential signal of the four-phase local oscillator signal in a differential mixer (I mixer). The RF signal is also mixed with a quadrature-phase differential signal Q components of the four-phase local oscillator signal in a differential mixer (Q mixer). The common mode levels of the I and Q differential mixer outputs are compared to a reference DC voltage to generate I and Q error signals. The I and Q error signals are time-multiplexed, and fed back to the RF input center tap.

13 Claims, 5 Drawing Sheets

TIME-MULTIPLEXED COMMON MODE FEEDBACK FOR PASSIVE QUADRATURE RF MIXERS

FIELD OF THE INVENTION

The present invention relates generally to radio frequency (RF) receivers, and in particular to a system and method of time-multiplexed, common mode feedback to reduce second order intermodulation interference in a passive quadrature RF mixer.

BACKGROUND

RF receivers in RF communication systems are well known in the art. RF mixers are fundamental building blocks in RF receivers. In a typical RF receiver architecture, a Low Noise Amplifier (LNA) amplifies a weak signal received at an antenna, and passes the amplified received signal to an RF mixer for down-conversion. The RF mixer down-converts the received signal from a carrier frequency to an intermediate frequency by mixing it with a signal from a local oscillator. The intermediate frequency signal may then be filtered and processed to convert it to a baseband frequency.

A Zero Intermediate Frequency (ZIF) receiver—also known in the art as a homodyne or "direct conversion" receiver—converts an input RF signal directly to baseband. ZIF receivers are more easily integrated into integrated circuits, as the need for pass-band filters is eliminated, and the space requirement and complexity are reduced.

Mixers in practice may be designed as passive or active. Active mixers can provide gain while down converting the RF signal, but are generally less linear and have higher noise figures—particularly the flicker noise contribution, which is harmful for narrow band RF applications such as GSM.

RF communication systems usually demand a duplex operation mode in a transceiver, wherein the receiver and transmitter work simultaneously. Because the transmitter emits signals at high power levels, the receiver suffers from interference. As a result, very good linearity is required for both the LNA and the mixer. For a ZIF or direct conversion receiver, protecting the receiver from interference created by transmitter is very important. In particular, the second order intermodulation product must be minimized. The measure of this is known as the second order input intercept point (IIP2).

In order to reach better IIP2, RF signals can be processed differentially. Differential RF receivers use a symmetric topology, in which nonlinearity caused by device parameters is cancelled. For this purpose, using a Balun to do single-end to differential conversion is beneficial. However, for quadrature mixer operation, a two-phase clock scheme is not possible unless isolation is provided, since the two output loads will interact, resulting in lower conversion gain, lower linearity, and IQ leakage. A known mixer architecture that solves this problem uses a four-phase clock scheme. This isolates four conducting periods, i.e., interleaving I and Q, but does not short-circuit the two loads.

It is known to use feedback to suppress the second order intermodulation component, and effectively increase the IIP2. An article by Brandolini, et al., titled "A 750 mV Fully Integrated Direct Conversion Receiver Front-End for GSM in 90-nm CMOS," published in the Journal of Solid-State Circuits, June 2007, incorporated herein by reference in its entirety, describes one means to do so. The output common-mode level is detected and compared to the desired DC output common-mode level. The discrepancy is then fed back as an error signal to voltage controlled current sources, forming a negative feedback loop. However, the technique used in the article addresses how to make the IIP2 compensation for an active mixer, i.e. a Gilbert topology, where the feedback signal controls the bias currents. Since the feedback loop is placed inside the mixer core, there is no problem having two IIP2-compensated mixers work in parallel, e.g. in an IQ-architecture.

However, when using two passive mixers in an IQ-architecture fed by a differential balun, the error signals from the mixers must be fed back to a joint input source, i.e. if the feedback signal from each mixer is not separated in the time domain, the feedback path will be corrupted. For example, in FIG. 1, CT,Q and CT,I will create distortion if connected together to the center tap CT of the input signal source.

SUMMARY

According to one or more embodiments described herein, I/Q isolation is maintained in a common mode feedback by time multiplexing I and Q error signals in the feedback path using the four-phase LO signal. An RF signal is received at a differential input having a center tap. The differential RF signal is mixed with an in-phase differential local oscillator signal in an I differential mixer. The differential RF signal is also mixed with a quadrature-phase differential local oscillator signal in a Q differential mixer. The common mode levels of the I and Q differential mixer outputs are compared to a reference DC voltage to generate I and Q error signals and the I and Q error signals are time-multiplexed, and fed back to the RF input center tap.

BRIEF DESCRIPTION OF THE DRAWINGS

FIGS. 5A and 5B graph first and second harmonics with feedback.

DETAILED DESCRIPTION

Figure 1:
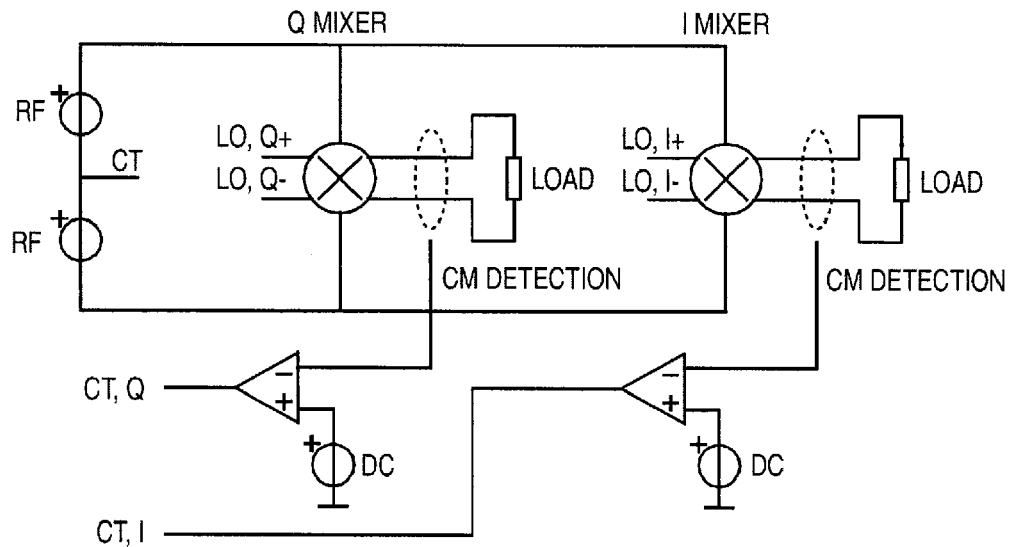
FIG. 1 is a functional block diagram of a prior art RF differential mixer.
Figure 2:
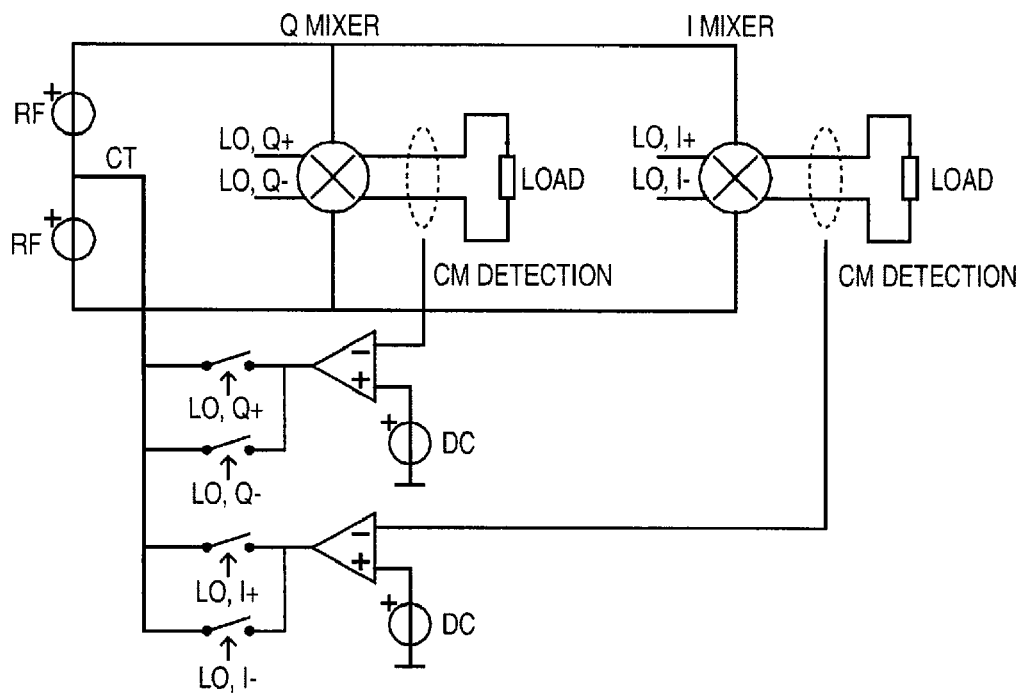
FIG. 2 is a functional block diagram of an RF differential mixer having time-multiplexed feedback through a switching array.
Figure 3:
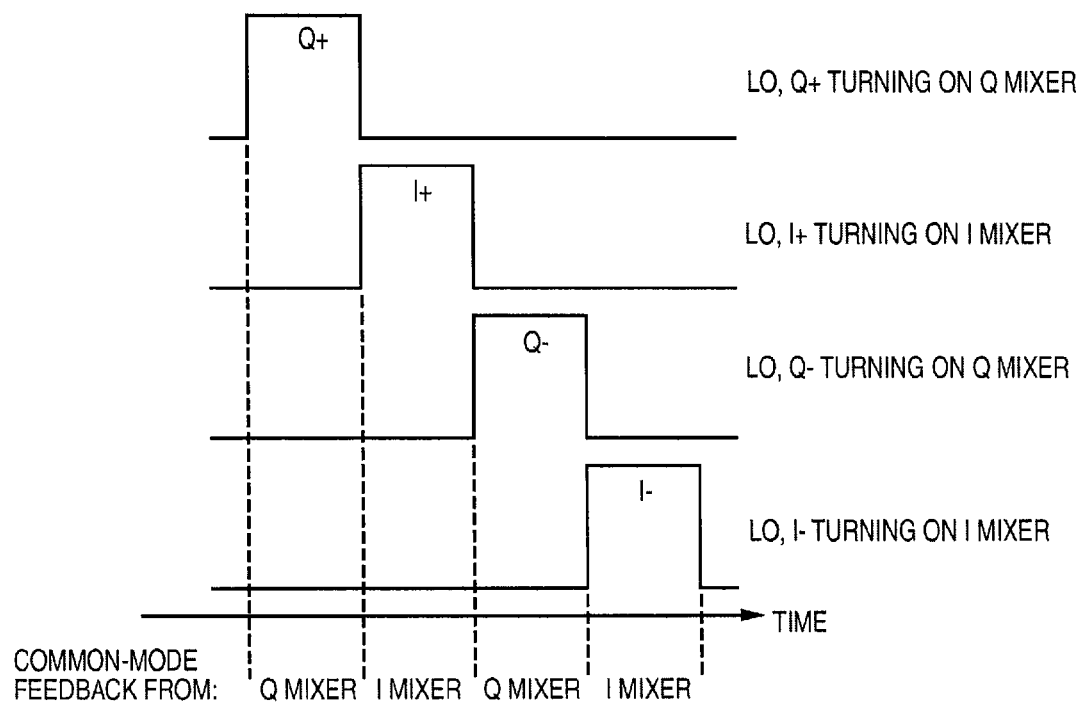
FIG. 3 is a timing diagram of switch actuating signals.

According to embodiments of the present invention, a common-mode feedback for an RF differential mixer operating on a four-phase clock reduces second order intermodulation to raise the effective IIP2. The passive RF differential mixer is depicted in FIG. 2. The feedback signal is generated by comparing the common-mode outputs of the I and Q differential mixer to a reference DC level. The error signal thus generated is multiplexed in the time domain, by means of a switching array. The switching array comprises, e.g., four switches controlled by four phases of a local oscillator (LO,Q+, LO,Q−, LO,I+, LO, I−). In principle, this is equivalent to adding a second four-phase mixer function in the feedback path, mixing the low-frequency second order tone back to the RF input, where it controls the common-mode level of the differential RF source. Due to the time multiplexing, the feedback loop is only present when it is needed, and isolation is preserved between the I and Q systems. Since the mixers are also controlled by the four 25% duty cycle local oscillator clock signals, no extra signals are needed to control the switching array. FIG. 3 depicts the switching signals.

An embodiment similar to that depicted in FIG. 2 was modeled and simulated. The test bench circuit for simulation comprises an ideal differential RF source and two passive CMOS mixers. The four-phase LO signal is generated by ideal signal sources and the two feedback loops comprise ideal operational amplifiers.

Figure 4B:
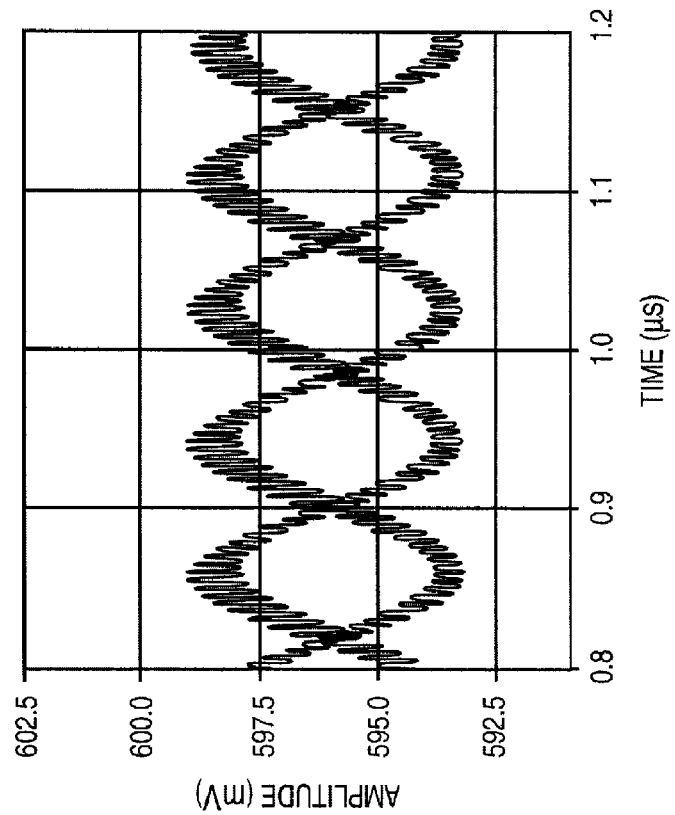
FIGS. 4A and 4B graph first and second harmonics without feedback.
Figure 4A:
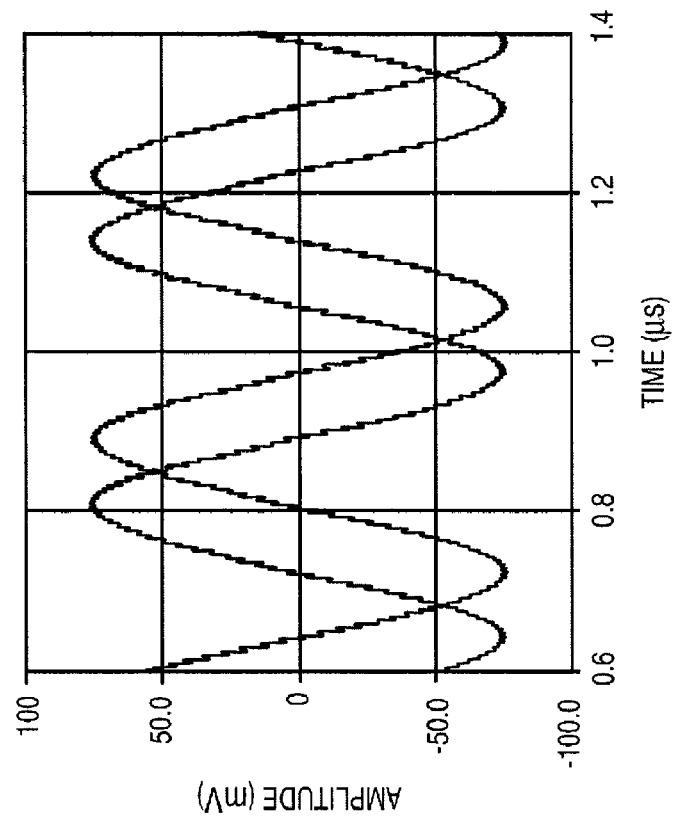
Figure 5B:
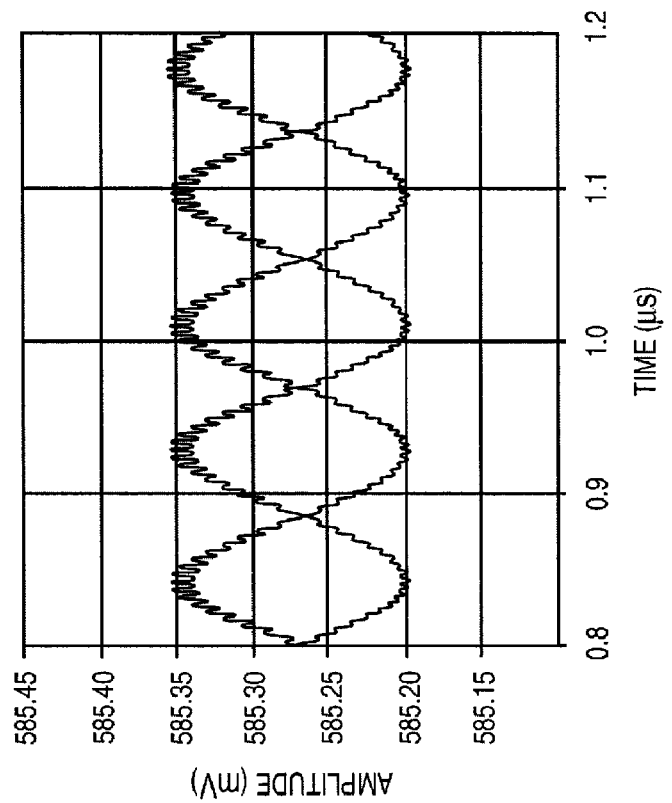
Figure 5B:
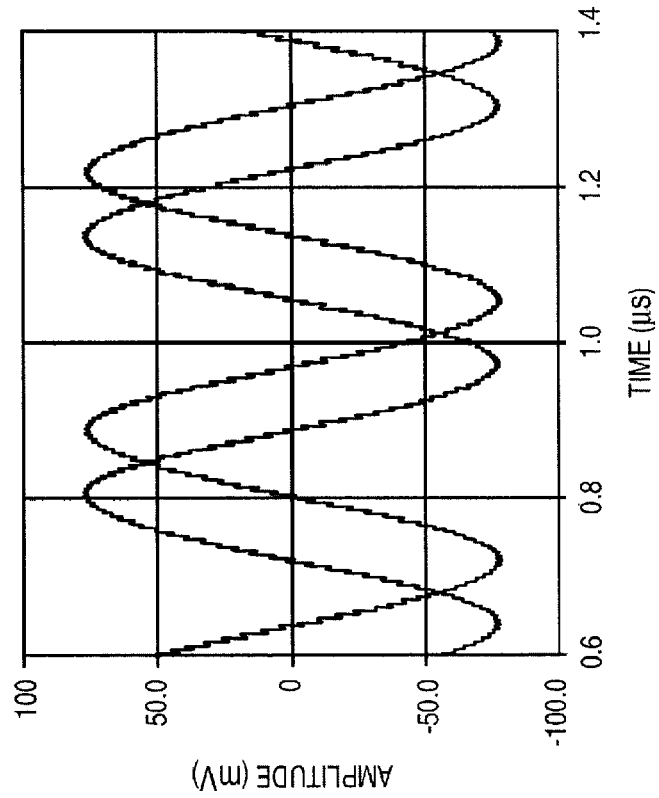

FIG. 4A graphs the first harmonic, and FIG. 4B the second harmonic, of a simple transient simulation carried out using the test bench without feedback. FIGS. 5A and 5B graph these harmonics with common-mode feedback applied. A differential RF source at 100 MHz is down-converted using I and Q four-phase passive quadrature mixers. The LO signals have a frequency of 103 MHz and 25% duty cycle, as depicted in FIG. 3. As FIGS. 4 and 5 show, the differential output signal at 3 MHz is unchanged in amplitude independent of whether the feedback loop is on or off, which illustrates that there is no gain penalty with embodiments of the present invention. However, comparing FIGS. 4B and 5B discloses a significant reduction in the amplitude of the second order harmonic distortion, appearing as an output common-mode signal at 6 MHz, when the common-mode feedback circuit depicted in FIG. 2 is applied.

Figure 6:
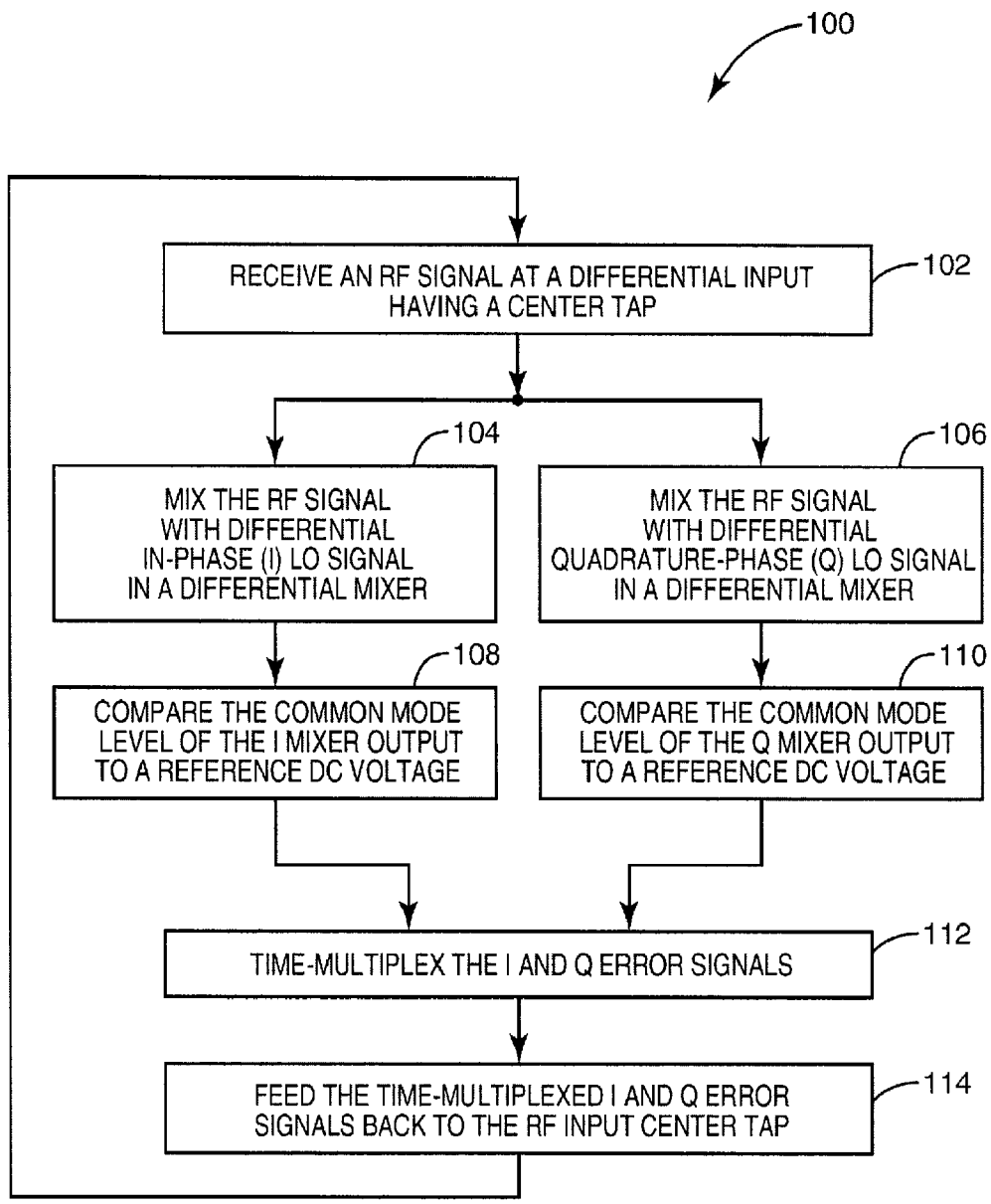
FIG. 6 is a flow diagram of a method of down-converting an RF signal.

FIG. 6 depicts a method 100 of down-converting an RF signal to reduce second order intermodulation interference. An RF signal is received at a differential input, such as a Balun, having a center tap (block 102). The differential RF signal is mixed with an in-phase differential LO signal in a passive differential mixer (I mixer) (block 104). In parallel, the differential RF signal is mixed with a quadrature-phase differential LO signal in a passive, differential mixer (Q mixer) (block 106). Also in parallel, the common mode level of the output of each mixer is compared to a reference DC voltage, to generate I and Q error signals (blocks 108, 110). The I and Q error signals are time multiplexed (block 112), such as via a switching array controlled by the four-phase LO clock signal. The multiplexed error signals are then fed back to the RF input center tap (block 114). In this manner, each error signal is only applied to the input during a corresponding mixer phase, and I and Q separation is maintained.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A method of down-converting a Radio Frequency (RF) signal, comprising:
   receiving the RF signal at a differential input having a center tap;
   mixing the RF signal with an in-phase differential local oscillator signal in an I differential mixer;
   mixing the RF signal with a quadrature-phase differential local oscillator signal in a Q differential mixer;
   comparing the common mode level of the I and Q differential mixer outputs to a reference DC voltage to generate I and Q error signals;
   time-multiplexing the I and Q error signals; and
   feeding the time-multiplexed I and Q error signals back to the RF input center tap.

2. The method of claim 1 wherein time-multiplexing the I and Q error signals comprises interleaving the I and Q error signals to the RF input center tap via a switching matrix.

3. The method of claim 2 wherein the switching matrix is controlled by a four-phase clock applied to the I and Q differential mixers.

4. The method of claim 1 wherein the I and Q differential mixers are passive.

5. The method of claim 1 wherein the I and Q differential mixers convert the RF signal to a baseband frequency.

6. A Radio Frequency (RF) mixer, comprising:
   a differential RF input having a center tap;
   an in-phase (I) differential mixer receiving a differential RF signal and an in-phase differential signal of a four-phase local oscillator signal, and operative to down-convert the differential RF signal to an intermediate frequency;
   a quadrature (Q) differential mixer receiving the differential RF signal and a quadrature-phase differential signal of the four-phase local oscillator signal, and operative to down-convert the differential RF signal to an intermediate frequency;
   an I comparator operative to generate an I error signal based on comparing the common mode level of the I mixer output to a reference DC voltage;
   a Q comparator operative to generate a Q error signal based on comparing the common mode level of the Q mixer output to the reference DC voltage; and
   a switching array interposed between the I and Q error signals and the RF input center tap and receiving the four-phase LO signal, the switching array operative to selectively couple either the I or Q error signal to the RF input center tap in a time-multiplexed manner.

7. The RF mixer of claim 6 wherein the intermediate frequency is a desired baseband frequency.

8. The RF mixer of claim 6 wherein the switching array comprises two switches connected to the I comparator output and two different switches connected to the Q comparator output, the other side of all four switches connected to the RF input center tap, and wherein each switch is actuated by a separate phase of the four-phase LO signal.

9. The RF mixer of claim 6 wherein the I and Q error signals are coupled to the RF input center tap in an interleaved pattern.

10. The RF mixer of claim 6 wherein the mixers, comparators, and switching array are integrated on a single integrated circuit.

11. A method of suppressing second order intermodulation interference in a passive quadrature RF mixer, comprising:
    separately mixing a differential RF input signal with in-phase and quadrature-phase differential signals of a four-phase local oscillator signal, to generate I and Q components of an intermediate frequency signal;
    comparing the common mode levels of the I and Q intermediate frequency signal components to a reference DC voltage to generate separate I and Q error signals; and
    feeding the I and Q error signals back to a center tap of the differential RF input signal in mutually exclusive, time-multiplexed pattern.

12. The method of claim 11 wherein feeding the I and Q error signals back to a center tap of the differential RF input signal in mutually exclusive, time-multiplexed pattern comprises time multiplexing the I and Q error signals to the center tap of the differential RF input signal in response to the four-phase LO signal.

13. The method of claim 11 wherein the intermediate frequency is baseband frequency.

* * * * *

UNITED STATES PATENT AND TRADEMARK OFFICE
CERTIFICATE OF CORRECTION

| | | |
|---|---|---|
| PATENT NO. | : 7,945,230 B2 | Page 1 of 1 |
| APPLICATION NO. | : 12/118517 | |
| DATED | : May 17, 2011 | |
| INVENTOR(S) | : Tillman | |

It is certified that error appears in the above-identified patent and that said Letters Patent is hereby corrected as shown below:

In Sheet 4 of 5, insert -- FIG. 5A -- below the un-numbered Figure.

Signed and Sealed this
Fourth Day of October, 2011

David J. Kappos
*Director of the United States Patent and Trademark Office*